(12) United States Patent
Stones

(10) Patent No.: US 8,684,031 B2
(45) Date of Patent: Apr. 1, 2014

(54) APPARATUS FOR CONVEYING A WASTE STREAM

(75) Inventor: Ian David Stones, Burgess Hill (GB)

(73) Assignee: Edwards Limited (GB)

( * ) Notice: Subject to any disclaimer, the term of this patent is extended or adjusted under 35 U.S.C. 154(b) by 618 days.

(21) Appl. No.: 12/309,842

(22) PCT Filed: Jul. 19, 2007

(86) PCT No.: PCT/GB2007/050414
§ 371 (c)(1),
(2), (4) Date: Jan. 28, 2010

(87) PCT Pub. No.: WO2008/017880
PCT Pub. Date: Feb. 14, 2008

(65) Prior Publication Data
US 2010/0126605 A1    May 27, 2010

(30) Foreign Application Priority Data

Aug. 8, 2006    (GB) .................................. 0615722.6

(51) Int. Cl.
*F04F 3/00*    (2006.01)
*F01B 25/02*    (2006.01)
*F04B 41/06*    (2006.01)

(52) U.S. Cl.
USPC ...................... 137/565.23; 137/565.33; 417/3

(58) Field of Classification Search
USPC ............ 137/602, 606, 565.3, 565.23, 565.33, 137/263; 417/3
See application file for complete search history.

(56) References Cited

U.S. PATENT DOCUMENTS

| | | | |
|---|---|---|---|
| 2,867,234 A * | 1/1959 | Billington | 137/505.11 |
| 4,725,204 A | 2/1988 | Powell | |
| 5,950,675 A * | 9/1999 | Minami et al. | 137/606 |
| 6,165,272 A | 12/2000 | Liu | |
| 6,736,606 B1 * | 5/2004 | Ohmi et al. | 417/244 |
| 2001/0001950 A1 | 5/2001 | Kawamura et al. | |
| 2008/0017105 A1 * | 1/2008 | Moriya et al. | 118/708 |

FOREIGN PATENT DOCUMENTS

| | | |
|---|---|---|
| JP | 5234902 A | 9/1993 |
| JP | 05234902 A * | 9/1993 |
| JP | 2004-218648 | 8/2004 |
| WO | WO 2005/042160 A2 | 5/2005 |
| WO | WO 2006/061020 A1 | 6/2006 |

OTHER PUBLICATIONS

United Kingdom Search Report of Application No. GB 0615722.6 mailed Nov. 28, 2006; Claims searched: 1 at least; Date of search: Nov. 24, 2006.

(Continued)

*Primary Examiner* — Craig Schneider
*Assistant Examiner* — Atif Chaudry
(74) *Attorney, Agent, or Firm* — Shumaker & Sieffert, P.A.

(57) ABSTRACT

Apparatus for conveying waste streams exhausted from first and second chambers is provided. The apparatus comprises first conduit means comprising an inlet for receiving a waste stream exhausted from the first chamber, and an outlet, and a second conduit means comprising an inlet for receiving a waste stream exhausted from a second chamber, and an outlet. The outlets of the first and second conduit means are connected together. The first conduit means comprises means for generating sonic choking of gas being conveyed towards the outlet of the first conduit means in order to inhibit migration of a component of the waste stream exhausted from the second chamber towards the first chamber.

20 Claims, 4 Drawing Sheets

(56) References Cited

OTHER PUBLICATIONS

PCT Notification of Transmittal of the International Search Report and the Written Opinion of the International Searching Authority, or the Declaration of International Application No. PCT/GB2007/050414; Date of mailing; Nov. 22, 2007.
PCT International Search Report of International Application No. PCT/GB2007/050414; Date of mailing of International Search Report: Nov. 22, 2007.
PCT Written Opinion of the International Searching Authority of International Application No. PCT/GB2007/050414; Date of mailing: Nov. 22, 2007.
English Translation of the Notice of Preliminary Rejection received in corresponding KR Application No. 2009-7002472 mailed Jun. 24, 2013, 5 pgs.
English Translation of the Notice of Final Rejection mailed Dec. 11, 2013 in corresponding KR Application No. KR2009-7002472, 2 pgs.

* cited by examiner

APPARATUS FOR CONVEYING A WASTE STREAM

FIELD OF THE INVENTION

This invention relates to apparatus for conveying a waste stream exhausted from first and second chambers.

BACKGROUND OF THE INVENTION

A primary step in the fabrication of semiconductor devices is the formation of a thin film on a semiconductor substrate by chemical reaction of vapour precursors. One known technique for depositing a thin film on a substrate is chemical vapour deposition (CVD). In this technique, process gases are supplied to an evacuated process chamber housing the substrate and react to form a thin film over the surface of the substrate.

A CVD process used to deposit an aluminium layer on a substrate is MOCVD (metal organic chemical vapour deposition), in which an organoaluminium precursor entrained within a carrier gas, such as nitrogen or argon, is supplied to the process chamber. Hydrogen is also supplied to the process chamber for reducing the precursor. The process chamber is evacuated, and heated to a deposition temperature, generally less than 500° C., at which the precursor decomposes and aluminium is deposited on to the substrate.

Physical vapour deposition (PVD) is a vaporisation coating technique involving the transfer of material on an atomic level. One example of a PVD technique used in semiconductor manufacture is sputter coating, in which atoms in a solid target material located within an evacuated process chamber are ejected into the gas phase due to the bombardment of the material with energetic ions. These atoms are deposited on a substrate located within the process chamber to form a thin film on the substrate.

The presence of contaminants in the residual gas of the process chamber can be detrimental to the quality of the film or layer formed on the substrate. The dominant residual gas is usually water but may also be oxygen or hydrogen. Impurities within the generated layer can result in one or more of low density, low stress film, intrinsic stress in the film, increased electrical resistivity of the film and a reduction in the positive temperature coefficient of the resistance of the film. Hydrogen, being a light gas, can be particularly intrusive and can lead to hydrogen embrittlement of the generated layer. In PVD processes the avoidance of contamination by hydrogen is, therefore, of particular importance.

In such deposition processes, the residence time of the deposition gases in the process chamber is relatively short, and so only a small proportion of the gas supplied to the chamber is consumed during processing. Consequently, much of the gas supplied to the process chamber is exhausted from the chamber with the by-products from the deposition process, and conveyed by a conduit to a vacuum pump used to evacuate the process chamber.

A process tool usually comprises a plurality of process chambers, in which similar or different processes may be conducted at any given time. For example, in addition to one or more deposition chambers, the process tool may comprise one or more etch chambers within which features are etched within the substrate and/or within the thin film deposited on the substrate. Consequently, the waste stream from one chamber of the process tool can be incompatible with a process being undertaken in another chamber of the process tool. In view of this, the pumping arrangement used to evacuate the chambers generally comprises a secondary pump for each process chamber, as illustrated in FIG. 1. FIG. 1 illustrates first and second process chambers 2, 12 each being evacuated by a respective turbomolecular vacuum pump 4, 14. Each turbomolecular vacuum pump is backed by a respective primary pump 6, 16 in order to retain separation of the waste streams exhausted from the process chambers 2, 12.

It is desirable to reduce the complexity, footprint and power requirements of the overall pumping arrangement whilst improving reliability and costs associated with the pumping arrangement. It is, therefore, preferable to provide a single primary pump to back a number of separate secondary pumps, a configuration often implemented in pumping arrangements in which contamination is not an issue. An example of this configuration is illustrated in FIG. 2, wherein each turbomolecular vacuum pump 4,14 has a respective exhaust conduit 8, 18 connected to its outlet. The exhaust conduits 8, 18 merge to form a common exhaust conduit which is connected to an inlet of the primary vacuum pump 10.

Unfortunately, if there is an incompatibility between the components of one of the waste streams, say that being exhausted by secondary pump 14, and the process being undertaken in the other chamber 2, contamination can be an issue. Three significant examples of contamination in the vacuum field are:

hydrogen, even tiny quantities of which can cause embrittlement of a sputtered film; helium, the presence of which impacts heat transfer characteristics of the environment which affect the bulk properties of the film; and water, which can be significantly detrimental as it can react with precursor materials in the process chamber.

Contamination becomes particularly noticeable when the contaminant material is a light gas, namely a gas having a low relative molecular mass, such as hydrogen. This light gas may originate in chamber 12 and be conveyed via turbomolecular vacuum pump 14 into exhaust conduit 18. Due to the connection between the exhaust conduits 8, 18, this light gas may migrate backwards from the exhaust conduit 8 through the turbomolecular vacuum pump 4 and into chamber 2.

The partial pressure of the light gas is likely to be lower in chamber 2 than in exhaust conduit 8 due to the compression by the turbomolecular vacuum pump 4 but in some processes even trace quantities of contamination are undesirable. In these circumstances a pumping arrangement using a common primary pump 10 is inappropriate.

Most turbomolecular vacuum pumps are optimised for pumping heavier gases, rather than for light gases. Whereas a typical compression ratio for a heavier gas, such as nitrogen or argon, may exceed $1\times10^8$, the compression ratio for hydrogen is likely to be between $1\times10^3$ and $1\times10^5$ and for helium the compression ratio is likely to be in the region of $1\times10^5$ to $1\times10^7$.

Increasing the compression of a turbomolecular vacuum pump by adding additional pumping stages to the pumping mechanism would further increase the compression ratios for the light gases and therefore reduce the backward migration of a contaminant component from an outlet to an inlet of the turbomolecular vacuum pump. However, introduction of additional pumping stages would increase the cost and size of the pump.

It is an aim of the present invention to address the issue of backward migration of components of a waste stream through a vacuum pump to enable a common primary pump or common ducting to be implemented.

SUMMARY OF THE INVENTION

A first aspect of the present invention provides apparatus for conveying waste streams exhausted from first and second chambers, the apparatus comprising:

first conduit means comprising an inlet for receiving a waste stream exhausted from the first chamber, and an outlet; and second conduit means comprising an inlet for receiving a waste stream exhausted from a second chamber, and an outlet, wherein the outlets of the first and second conduit means are in fluid communication;

characterised in that the first conduit means comprises means for locally reducing the cross sectional area of part of the first conduit means to increase the local density of gas being conveyed towards the outlet of the first conduit means to an extent which inhibits migration of a component of the waste stream exhausted from the second chamber towards the first chamber.

A second aspect of the present invention provides a pumping arrangement comprising apparatus as aforementioned together with a first vacuum pump for evacuating a first chamber and having an outlet connected to the inlet of the first conduit means, and a second vacuum pump for evacuating a second chamber and having an outlet connected to the inlet of the second conduit means.

BRIEF DESCRIPTION OF THE DRAWINGS

The invention is described below in greater detail, by way of example only, with reference to the accompanying figures in which.

DETAILED DESCRIPTION OF THE INVENTION

A first aspect of the present invention provides apparatus for conveying waste streams exhausted from first and second chambers, the apparatus comprising:

first conduit means comprising an inlet for receiving a waste stream exhausted from the first chamber, and an outlet; and second conduit means comprising an inlet for receiving a waste stream exhausted from a second chamber, and an outlet, wherein the outlets of the first and second conduit means are in fluid communication;

characterised in that the first conduit means comprises means for locally reducing the cross sectional area of part of the first conduit means to increase the local density of gas being conveyed towards the outlet of the first conduit means to an extent which inhibits migration of a component of the waste stream exhausted from the second chamber towards the first chamber.

By introducing means for locally reducing the cross sectional area of part of the first conduit means, the density of the gas being conveyed through the first conduit means can be increased locally. This can present an obstruction to unwanted components of the waste stream exhausted from the second chamber so that a smaller proportion of this waste stream migrates back to the first chamber. In other words the backward transport of the contaminant material is suppressed by a particular suppression ratio.

The means for locally reducing the cross sectional area of part of the first conduit may comprise a flow restrictor, for example an aperture plate. The aperture of the plate may be of substantially smaller diameter than the remaining portion of the first conduit means in which it is located, for example 1.5 to 4.5 mm in comparison to 25 to 40 mm. A gas port may be provided upstream of the flow restrictor, with means being provided for delivering purge gas to the gas port. The purge gas may be nitrogen, argon or another medium which is compatible with processes being undertaken within the first chamber.

The component of the waste stream may be a gaseous component, for example a light gas such as hydrogen. Alternatively, the component of the waste stream may be a vapour or solid component.

The apparatus may comprise a common exhaust conduit for receiving the waste stream from the first and second conduit means.

A second aspect of the present invention provides a pumping arrangement comprising apparatus as aforementioned together with a first vacuum pump for evacuating a first chamber and having an outlet connected to the inlet of the first conduit means, and a second vacuum pump for evacuating a second chamber and having an outlet connected to the inlet of the second conduit means.

The first vacuum pump and the second vacuum pump may each be secondary vacuum pumps, such as turbomolecular vacuum pumps. A primary pump may be connected to the outlets of each of the first and second conduit means. Alternatively, the first vacuum pump and the second vacuum pump may each be primary pumps.

Figure 1:
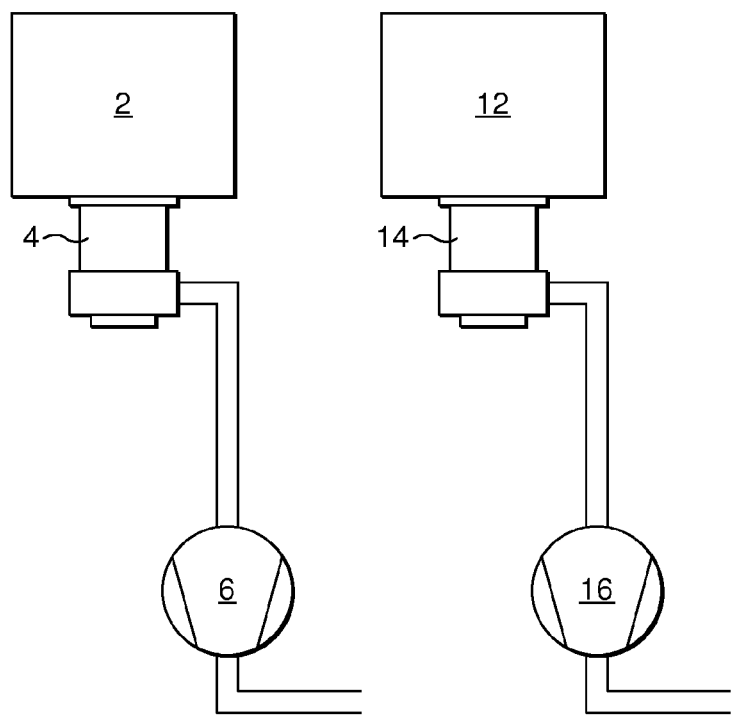
FIG. 1 illustrates a prior art pumping arrangement using isolated backing pumps.
Figure 2:
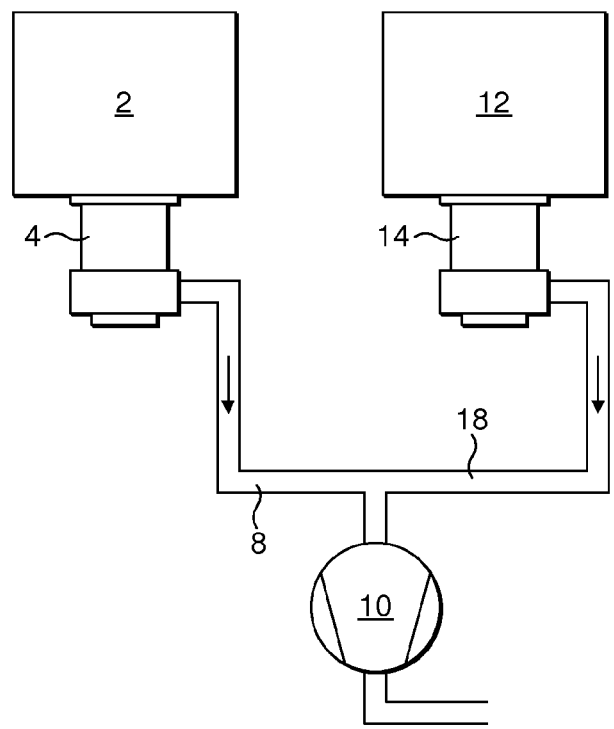
FIG. 2 illustrates another prior art pumping arrangement having a shared backing pump.
Figure 3:
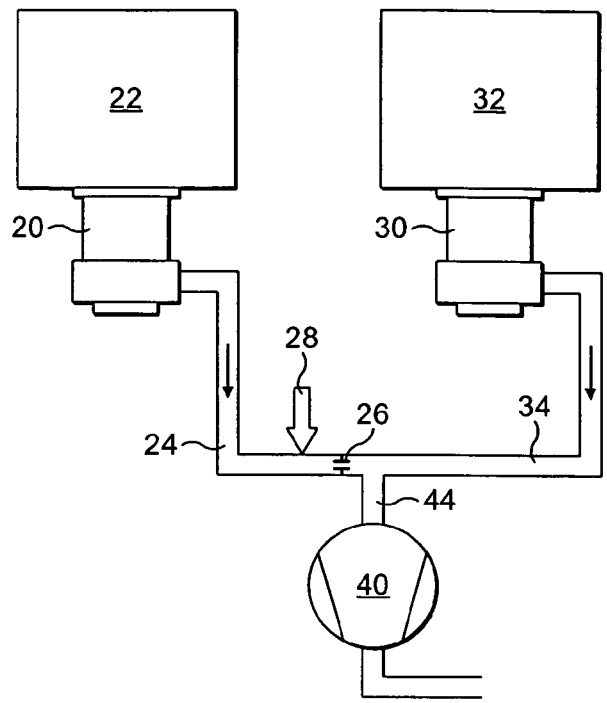
FIG. 3 illustrates a pumping arrangement having means for inhibiting backward migration of a component from the waste stream of one chamber towards another chamber.

A pumping arrangement is illustrated in FIG. 3. The pumping arrangement comprises a secondary pump, for example turbomolecular vacuum pump 20 having an inlet connected to an outlet of chamber 22, and a secondary pump, for example turbomolecular vacuum pump 30, having an inlet connected to an outlet of chamber 32.

In order to reduce the foot print, the power requirements and part count of the pumping arrangement it is desirable to have the turbomolecular vacuum pumps 20, 30 backed by a single primary, or backing, pump 40. The inlet of the backing pump 40 is connected to the turbomolecular pumps by apparatus for conveying the waste streams exhausted from the chambers 22, 32. The apparatus comprises first and second exhaust conduits 24, 34, and a third, common exhaust conduit 44. The first and second exhaust conduits 24, 34 each have an inlet connected to an outlet of a respective turbomolecular pump 20, 30 and an outlet. Each of these outlets is connected to one end of the common exhaust conduit 44, which is connected at the other end thereof to an inlet of the backing pump 40.

The composition of the waste stream transported by each turbomolecular pump during operation is determined by the process gases being supplied to the chambers 22, 32 and also any by-products resulting from those processes. As the waste stream from one chamber, for example chamber 32, may contain components which could prove to be detrimental to the process being carried out in the other chamber, for example chamber 22, it is desirable to prevent any materials or contaminants from being transported from the turbomolecular pump 30 back through the turbomolecular pump 20 and into the chamber 22. Higher levels of contamination result when the waste stream comprises light gases, namely gases having a low relative molecular mass, for example hydrogen, as turbomolecular vacuum pumping mechanisms have lower compression ratios with such gases (e.g. $1\times10^3$ to $1\times10^5$). The rate of transport of any contaminant into chamber 22 is determined by the relative pressures and flow rates of other gases in the exhaust conduits 24, 34, together with the compression and pumping speed of the turbomolecular pump 20.

In order to inhibit migration of a component of the waste stream exhausted from chamber 32 towards chamber 22, the first exhaust conduit 24 comprises means for locally elevating the density of, or in the limit, for generating sonic choking of, gas being conveyed from turbomolecular pump 20 towards the outlet of the first exhaust conduit 24.

Figure 4:
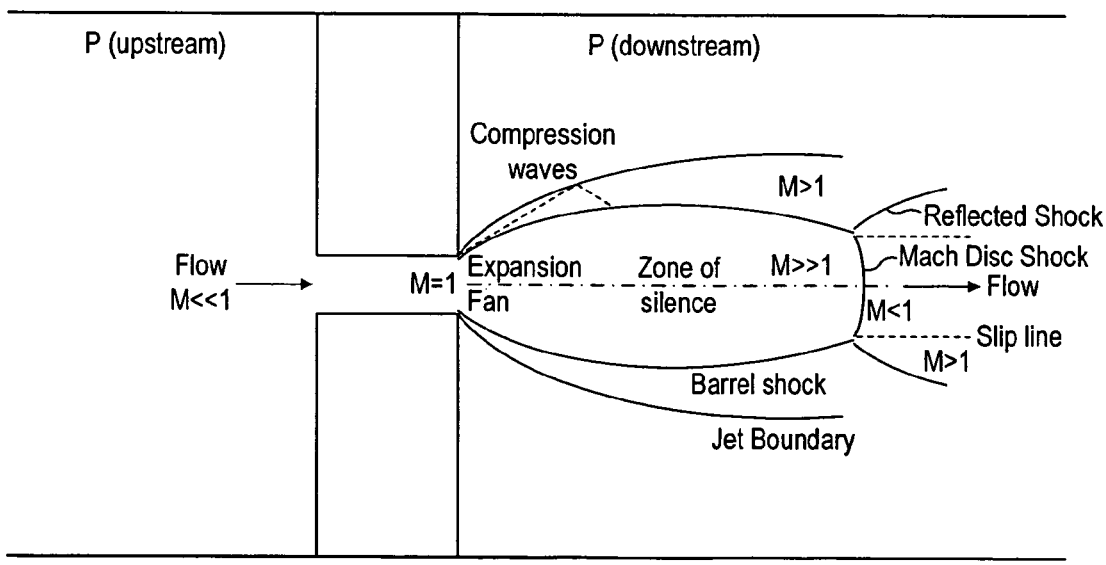
FIG. 4 illustrates the principals of choked flow and free jet expansion.

FIG. 4 illustrates the phenomena of sonic choking and free jet expansion. When a steady compressible viscous fluid flow stream encounters a geometrical restriction to the cross sectional area of the conduit along which it is passing, a Venturi effect is experienced by the flow. In other words, in order to conserve the mass flow rate along the conduit, the pressure of the fluid at the constriction will reduce and the speed and density of the fluid at the constriction will increase. The limiting condition of this Venturi effect occurs when the pressure at the constriction can no longer reduce and the speed of the fluid flow reaches a critical value, namely the speed of sound (Mach 1). Under such conditions the flow is said to be choked. A combination of factors affects the extent of the Venturi effect experienced and ultimately the onset of choked flow. These factors include the diameter of the constriction or aperture, the length of the constriction, the mass flow rate, the species being transported through the conduit, the pressure difference across the constriction and the temperature of the gas. By initiating a Venturi effect within the conduit a significant obstruction to flow against the prevailing contaminated fluid stream is introduced and suppression of contaminant materials is therefore achieved.

In the limiting case, the Venturi effect results in a choked condition as illustrated in FIG. 4. Downstream of the aperture illustrated in FIG. 4 a sudden expansion is provided so that free jet expansion occurs, as illustrated, resulting in a "zone of silence" through which any backward or cross flow of ambient fluid present downstream of the aperture could not readily pass. A barrier to such flow is therefore enhanced.

Returning to FIG. 3, a flow restrictor 26, for example an aperture plate, is located in the first exhaust conduit 24. The flow restrictor 26 serves to reduce locally the cross sectional area of the first exhaust conduit 24 so that, for a given pressure variation across the plate and mass flow rate through the plate, the speed and density of fluid travelling through the aperture of the flow restrictor 26 is forced to increase as discussed above, and, ultimately, a choked flow condition may be achieved.

In order to achieve a consistent level of suppression of backward migration of contaminant materials, a consistent gas source is introduced through a gas port 28 located upstream of the flow restrictor 26. Purge gas, for example nitrogen, argon or other gas having a large molecular mass and being compatible with the process being undertaken in the chamber 22, is introduced through port 28 at a given pressure and mass flow rate. Introduction of a separate purge gas source enables the inhibition of backward migration or suppression of contaminants to be controlled at all times so that conditions upstream of the flow restrictor 26 are predictable, even when the turbomolecular pump 20 has ceased operation. During such periods it is desirable to maintain the flow of purge gas to ensure that any undesirable components of the waste stream that linger in the second exhaust conduit 34 do not migrate back towards the chamber 22. Consequently a steady state flow regime is generated having an increased local density at the flow restrictor or, in the limit, a shock system, as illustrated in FIG. 4, is generated downstream of the flow restrictor 26 and a reliable obstruction to back flow through the flow restrictor 26 is achieved.

Delivery of purge gas alone through port 28 increases the positive mass flow rate through the flow restrictor 26 and therefore suppresses backward transmission of material towards the chamber 22. Once transitional or viscous flow is achieved at the flow restrictor 26 significant suppression ratios (up to $10^5$) can be achieved. As the delivery rate of purge gas is increased to a critical value a choked condition is achieved and backward transmission of any contaminant flow through the flow restrictor 26 is minimised (as the suppression ratio is now in excess of $10^5$).

Figure 5:
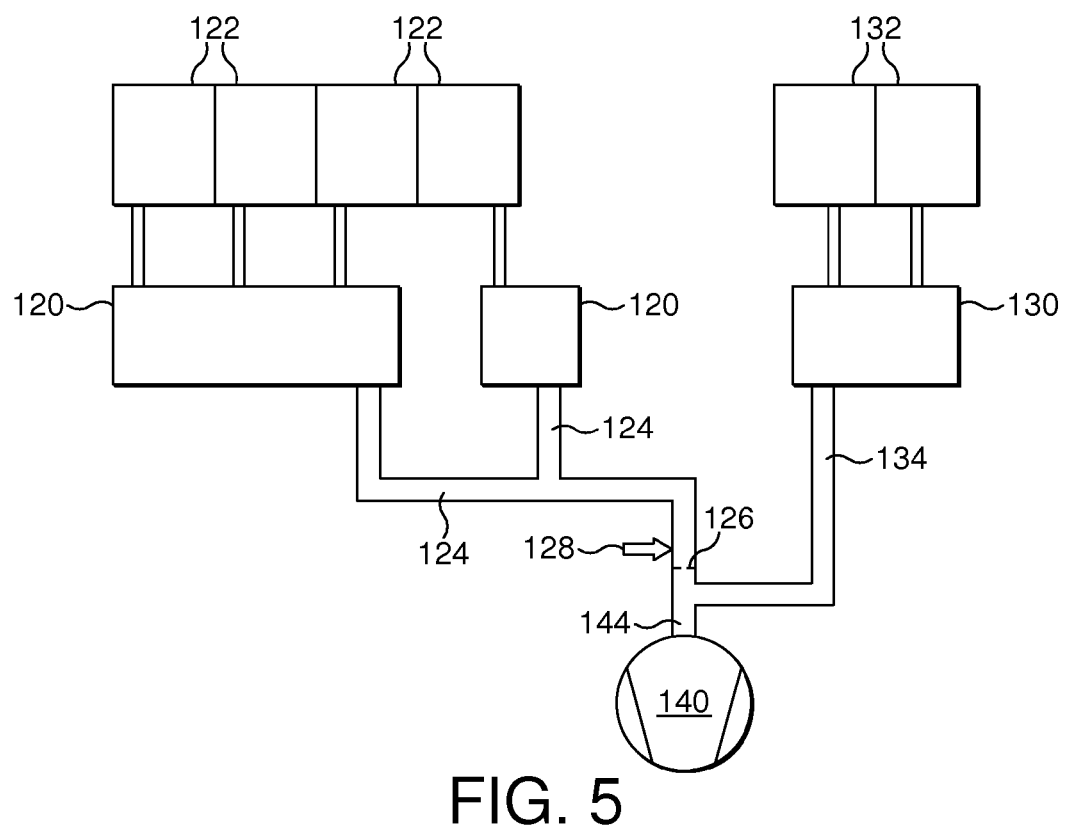
FIG. 5 illustrates a pumping arrangement having multiple chambers to be evacuated.

FIG. 3 illustrates a pumping arrangement attached to only two evacuable chambers 22, 32, one of which receives or generates contaminant material that may be detrimental to the other. This principal can readily be expanded to cover a pumping arrangement having multiple chambers 122, 132 evacuated by separate clusters of secondary pumps 120, 130 as illustrated, for example, in FIG. 5. It is desirable, for the reasons outlined above, that a single primary pump 140 is provided to back all of the secondary pumps 120, 130. In a similar manner to that described in relation to the arrangement of FIG. 3 an aperture plate, or other flow restrictor 126, is provided in the first exhaust conduit 124 connected to the secondary pumps 120. The flow restrictor 126 is located within the first exhaust conduit 124 prior to the junction between the first exhaust conduit 124, the second exhaust conduit 134 and the third, common exhaust conduit 144 which is, in turn, connected to an inlet of the primary pump 140. A purge gas port 128 is provided upstream of the flow restrictor 126 to enable purge gas to be delivered as described above to enable a steady, predictable flow regime, or shock system, to be achieved downstream of the flow restrictor 126.

Figure 6:
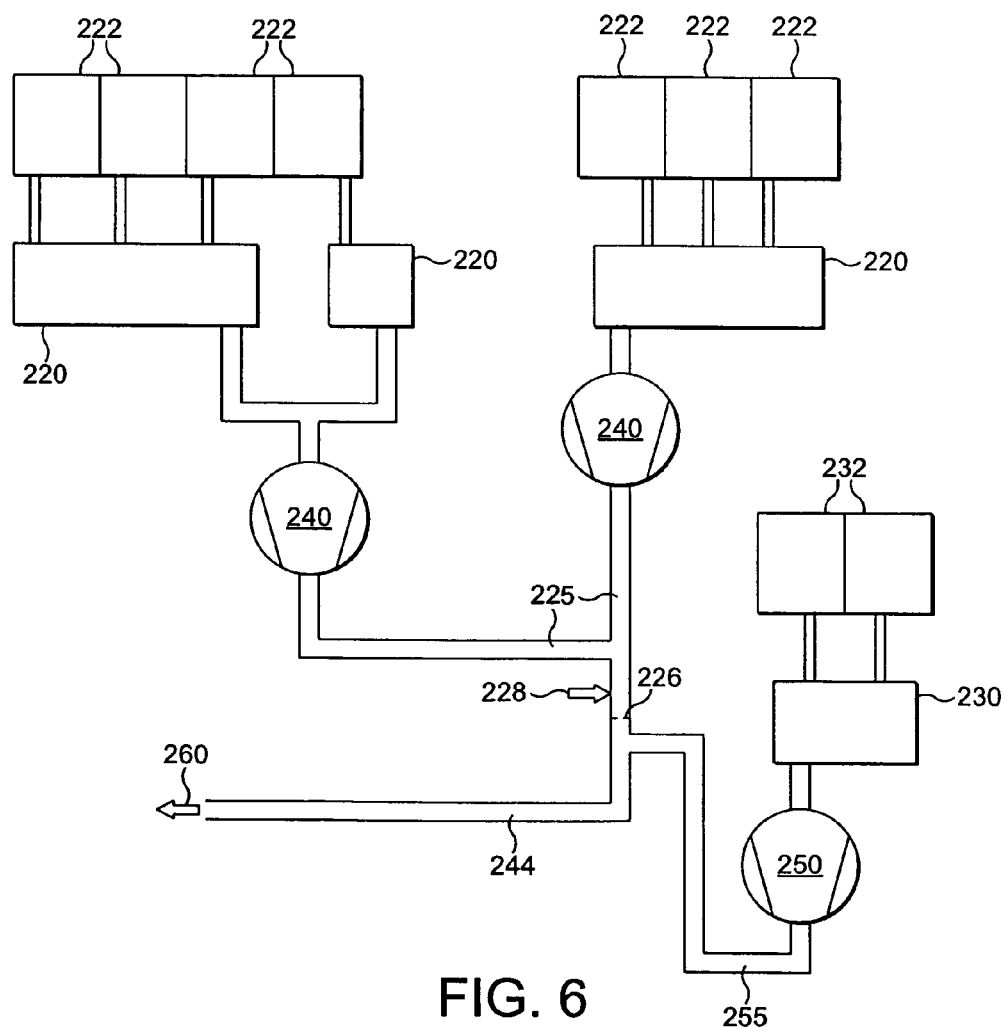
FIG. 6 illustrates a pumping arrangement having a means for inhibiting backward migration of contaminants into the primary pumps.

FIG. 6 illustrates a pumping arrangement wherein separate primary pumps 240, 250 are provided to back separate clusters of secondary pumps 220, 230. Consequently, the waste streams are kept separated for a greater portion of the fluid path through the pumping arrangement. In these circumstances, a reduced proportion of any contaminants present in the relatively dirty waste stream would migrate back to the "clean" chambers than in the examples described above. However, it is possible that components of the waste stream in, say, exhaust conduit 255 may react with components of the waste stream in exhaust conduit 225 resulting in by-products which may be hazardous or affect the reliability of the apparatus. The by-products may comprise solid materials which can build up on the internal surfaces of a pumping mechanism of a primary pump 240, 250 leading to reduced clearances and the resulting possibility of a clashing of rotor components with stator components. Such reactions could therefore lead to seizure or corrosion of the pumping mechanism or even to an ignition source which can prove particularly dangerous when flammable materials are being transported through the primary pump. It may be possible to prevent formation of these reactions near the primary pumps, for example by heating the primary pump/conduits to inhibit condensation or delivering solvents to the surfaces of the pumping mechanism to dissolve any deposits, but such measures can be expensive.

Consequently, it is advantageous to provide a flow restrictor 226 and a purge gas delivery port 228 in the exhaust conduit 225 of the primary pumps 240 prior to any junction with exhaust conduit 255 to inhibit mixing of the components of the waste streams in sensitive areas. Common exhaust conduit 244 can subsequently be used to convey any combined waste stream to an end point 260 where the combined waste stream may undergo further treatment or may be exhausted to atmosphere.

To achieve a choked flow condition, the pressure difference required across any of the aforementioned flow restrictors is typically of the order 2:1 ($P_{upstream}:P_{downstream}$ or $P_u:P_d$). Example values for a typical system may be, $P_u$=5 mbar and $P_d$=2.1 mbar corresponding to an aperture diameter of 4.5 mm and a flow rate of 1000 sccm. Example diameters of the first exhaust conduit are approximately 25 to 40 mm, consequently a 4.5 mm aperture diameter of the flow restrictor represents a substantial reduction in diameter.

While the foregoing description and drawings represent various embodiments of the present invention, it will be apparent to those skilled in the art that various changes and modifications may be made therein without departing from the true spirit and scope of the present invention.

I claim:

1. An apparatus for conveying waste streams exhausted from first and second vacuum process chambers, the apparatus comprising:
   a first conduit comprising:
      an inlet for receiving a waste stream exhausted from the first chamber,
      an outlet,
      means for locally reducing the cross sectional area of part of the first conduit to increase the local density of gas being conveyed towards the outlet of the first conduit to an extent which inhibits migration of a component of the waste stream exhausted from the second vacuum process chamber towards the first vacuum process chamber, and
      a gas port located upstream of the means for locally reducing the cross sectional area;
   a purge gas source configured to supply purge gas to the gas port at a given pressure and mass flow rate to establish a steady state flow regime at the means for locally reducing the cross sectional area; and
   a second conduit comprising an inlet for receiving a waste stream exhausted from a second chamber, and an outlet, wherein the outlets of the first conduit and second conduit are in fluid communication.

2. The apparatus of claim 1, wherein the means for locally reducing the cross sectional area of part of the first conduit comprises a flow restrictor.

3. The apparatus of claim 2, wherein the flow restrictor is an aperture plate.

4. The apparatus of claim 1, wherein the purge gas comprises nitrogen.

5. The apparatus of claim 1, wherein the purge gas comprises argon.

6. The apparatus of claim 1, wherein the component of the waste stream comprises a gaseous component.

7. The apparatus of claim 6, wherein the gaseous component comprises a light gas.

8. The apparatus of claim 7, wherein the gaseous component comprises hydrogen.

9. The apparatus of claim 7, wherein the gaseous component comprises helium.

10. The apparatus of claim 1, wherein the component of the waste stream comprises a vapor component.

11. The apparatus of claim 1, wherein the component of the waste stream comprises a solid component.

12. The apparatus of claim 1, further comprising a common exhaust conduit for receiving the waste stream from the first conduit and the second conduit.

13. A pumping arrangement comprising:
   first conduit comprising an inlet for receiving a waste stream exhausted from a first vacuum process chamber, an outlet, means for locally reducing the cross sectional area of part of the first conduit to increase the local density of gas being conveyed towards the outlet of the first conduit, and a gas port located upstream of the means for locally reducing to receive purge gas in parallel with the waste stream exhausted from the first vacuum process chamber;
   second conduit comprising an inlet for receiving a waste stream exhausted from a second vacuum process chamber, and an outlet, wherein the outlets of the first conduit and second conduit are in fluid communication, wherein the means for locally reducing increases the local density of gas being conveyed towards the outlet of the first conduit to an extent which inhibits migration of a component of the waste stream exhausted from the second vacuum process chamber towards the first vacuum process chamber;
   a purge gas source configured to supply purge gas to the gas port at a given pressure and mass flow rate to establish a steady state flow regime at the means for locally reducing the cross sectional area;
   a first turbomolecular vacuum pump for evacuating the first vacuum process chamber and having an outlet connected to the inlet of the first conduit; and
   a second turbomolecular vacuum pump for evacuating the second vacuum process chamber and having an outlet connected to the inlet of the second conduit.

14. The pumping arrangement of claim 13, wherein the first vacuum pump and the second vacuum pump are secondary vacuum pumps.

15. The pumping arrangement of claim 13, further comprising a primary pump connected to the outlets of the first conduit and the second conduit.

16. The pumping arrangement of claim 13, wherein the component of the waste stream comprises a vapor component.

17. The pumping arrangement of claim 13, wherein the component of the waste stream comprises a solid component.

18. The pumping arrangement of claim 13, wherein the means for locally reducing the cross sectional area of part of the first conduit comprises a flow restrictor.

19. The pumping arrangement of claim 18, wherein the flow restrictor is an aperture plate.

20. The pumping arrangement of claim 13, further comprising a common exhaust conduit for receiving the waste stream from the first conduit and the second conduit.

* * * * *

UNITED STATES PATENT AND TRADEMARK OFFICE
CERTIFICATE OF CORRECTION

PATENT NO. : 8,684,031 B2  
APPLICATION NO. : 12/309842  
DATED : April 1, 2014  
INVENTOR(S) : Ian David Stones It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1151 days.

Signed and Sealed this
Thirtieth Day of May, 2017

Michelle K. Lee
*Director of the United States Patent and Trademark Office*